(12) United States Patent
Nishibori et al.

(10) Patent No.: US 8,334,598 B2
(45) Date of Patent: Dec. 18, 2012

(54) POWER SEMICONDUCTOR DEVICE AND MANUFACTURING METHOD THEREFOR

(75) Inventors: Hiroshi Nishibori, Tokyo (JP);
Kunihiro Yoshihara, Tokyo (JP);
Minoru Ueshima, Tokyo (JP)

(73) Assignees: Mitsubishi Electric Corporation, Tokyo (JP); Senju Metal Industry Co., Ltd., Tokyo (JP)

( * ) Notice: Subject to any disclaimer, the term of this patent is extended or adjusted under 35 U.S.C. 154(b) by 90 days.

(21) Appl. No.: 12/868,375

(22) Filed: Aug. 25, 2010

(65) Prior Publication Data

US 2011/0089568 A1 Apr. 21, 2011

(30) Foreign Application Priority Data

Oct. 15, 2009 (JP) .................. 2009-238518

(51) Int. Cl.
*H01L 23/48* (2006.01)
*H01L 23/52* (2006.01)
*H01L 29/40* (2006.01)
(52) U.S. Cl. ......... 257/772; 257/737; 257/779; 257/780
(58) Field of Classification Search .................. 257/772, 257/734, 735, 737, 738, 780, 762, 766, 779, 257/781, 782
See application file for complete search history.

(56) References Cited

U.S. PATENT DOCUMENTS

| | | | |
|---|---|---|---|
| 6,224,690 B1 | 5/2001 | Andricacos et al. | |
| 6,563,211 B2 | 5/2003 | Fukada et al. | |
| 2002/0060356 A1 | 5/2002 | Nishibori et al. | |
| 2002/0192488 A1* | 12/2002 | Kurihara et al. | 428/621 |
| 2007/0125449 A1* | 6/2007 | Kajiwara et al. | 148/23 |
| 2007/0246833 A1 | 10/2007 | Soga et al. | |
| 2010/0289148 A1 | 11/2010 | Soga et al. | |

FOREIGN PATENT DOCUMENTS

| | | |
|---|---|---|
| CN | 1400081 A | 3/2003 |
| EP | 1 267 400 A2 | 12/2002 |
| EP | 1 267 400 A3 | 12/2002 |
| JP | 9-181125 | 7/1997 |
| JP | 10-193171 | 7/1998 |
| JP | 10-286689 | 10/1998 |
| JP | 2000-277876 A | 10/2000 |
| JP | 2001-144111 | 5/2001 |
| JP | 2001-244622 | 9/2001 |
| JP | 2003-124438 A | 4/2003 |
| JP | 2006-54227 | 2/2006 |
| JP | 2007-335767 A | 12/2007 |

(Continued)

OTHER PUBLICATIONS

Extended European Search Report issued on May 10, 2011 in corresponding European Application No. 10 17 5447.

(Continued)

*Primary Examiner* — Chuong A. Luu
(74) *Attorney, Agent, or Firm* — Oblon, Spivak, McClelland, Maier & Neustadt, L.L.P.

(57) ABSTRACT

A power semiconductor device includes a substrate, an element circuit pattern formed on the substrate and made of Cu covered with an electroless Ni—P plating layer, and a power semiconductor element bonded to the element circuit pattern by a solder, wherein the solder is an alloy of Sn, Sb, and Cu, and the weight percent of Cu is in the range of 0.5 to 1%, inclusive.

6 Claims, 11 Drawing Sheets

FOREIGN PATENT DOCUMENTS

| | | |
|---|---|---|
| JP | 2009-60101 | 3/2009 |
| JP | 2009-70863 A | 4/2009 |
| KR | 10-0207888 | 7/1999 |

OTHER PUBLICATIONS

Partial European Search Report issued Feb. 10, 2011, in Application No. / Patent No. 10175447.1-2203.

Mulugeta Abtew, et al., "Lead-free Solders in Microelectronics", Materials Science and Engineering, vol. 27, No. 5-6, XP004198436, Jun. 1, 2000, pp. 95-141.

Bryan Y. Y. Ong, "Qualification and Optimization of Sn Based Soft Solders: A Refinement for Bi Based Lead Free Soft Solders for EFM Volume Production", 28th IEEE/CPMT/SEMI International Electronics Manufacturing Technology Symposium , Jul. 16, 2003, pp. 69-79.

G. Effenberg, et al., (Editor), Materials Science International Team: "Cu-Sb-Sn (Cooper-Antimony-Tin)", "Numerical Data and functional Relationship in Science and Technology", New Series / Landolt-Borstein, Group 4: Physical Chemistry vol. 11: "Ternary Alloy Systems: Phase Diagrams, Crystallographic and Thermodynamic Data", Subvolume C, Non-Ferrous Metal Systems, Jan. 1, 2007, pp. 420-436.

Office Action issued Jan. 20, 2012, in Korean Patent Application No. 10-2010-0097146 with English translation.

Office Action issued Jul. 4, 2012 in Chinese Patent Application No. 201010521765.1 with partial English translation.

Office Action issued in Korean Application No. 9-5-2012-057796362 (w/partial English translation).

* cited by examiner

| solder alloy composition | solidus line (°C) | liquidus line (°C) | melt percent at 237°C |
|---|---|---|---|
| Sn-5Sb | 240 | 243 | 0% |
| Sn-5Sb-0.6Cu | 233 | 238 | 65% |
| Sn-6Sb-0.6Cu | 235 | 240 | 25% |
| Sn-6Sb-1.6Cu | 235 | 263 | 18% |
| Sn-6.5Sb-0.6Cu | 235 | 240 | 10% |
| Sn-6.5Sb-1.6Cu | 235 | 263 | 7% |
| Sn-7Sb | 243 | 247 | 0% |
| Sn-7Sb-0.5Cu | 237 | 242 | 1.80% |
| Sn-7Sb-0.6Cu | 237 | 242 | 2% |
| Sn-7Sb-1Cu | 237 | 238 | 3% |
| Sn-7Sb-1.6Cu | 237 | 263 | 3% |
| Sn-7Sb-2Cu | 237 | 280 | 2% |
| Sn-8Sb-0.6Cu | 238 | 246 | 0.20% |
| Sn-8Sb-1.6Cu | 238 | 259 | 0% |
| Sn-9Sb-0.6Cu | 239 | 255 | 0% |

FIG. 12

| solder alloy composition | maximum dissolution thickness[μm] | average dissolution thickness[μm] | thickness of the thinnest portion of the remaining electrode[μm] |
|---|---|---|---|
| Sn-5Sb | 1.7 | 1.4 | 0(penetration) |
| Sn-5Sb-0.02Cu | 1.7 | 1.4 | 0(penetration) |
| Sn-5Sb-0.3Cu | 1.7 | 1.3 | 0(penetration) |
| Sn-5Sb-0.5Cu | 1.3 | 1 | 0.4 |
| Sn-7Sb-0.3Cu | 1.7 | 1.3 | 0(penetration) |
| Sn-7Sb-0.5Cu | 1.2 | 1 | 0.5 |
| Sn-7Sb-0.8Cu | 1.1 | 0.8 | 0.6 |
| Sn-7Sb-1Cu | 0.9 | 0.7 | 0.8 |

[specification]
(1) solder under the substrate ; 95Sn-5Sb
(2) initial thickness of the Ni-P plating ; 4μm
(3) high temperature strage evaluation test ; 200hours at 175°C

POWER SEMICONDUCTOR DEVICE AND MANUFACTURING METHOD THEREFOR

BACKGROUND OF THE INVENTION

1. Field of the Invention

The present invention relates to a power semiconductor device manufactured using at least two types of unleaded solders, and also relates to a method of manufacturing such a semiconductor device.

2. Background Art

Power semiconductor devices are made up, e.g., of a power semiconductor element, such as an IGBT or a high voltage diode, packaged in a resin case. An exemplary power semiconductor device will be described with reference to FIG. 17. FIG. 17 omits the resin case of the power semiconductor device to illustrate the way in which the power semiconductor element is soldered. As shown in FIG. 17, circuit patterns 202 and 204 are formed on the top surface of a ceramic substrate 200. A power semiconductor element 214 is bonded to the circuit pattern 202 by a first step solder 210. The first step solder 210 has a composition of 95 wt % Sn-5 wt % Sb, where wt % is the abbreviation for weight percent. Further, an electrode terminal 220 is bonded to the circuit pattern 204 by a second step solder 218. The second step solder 218 has a composition of 96.5 wt % Sn-3 wt % Ag-0.5 wt % Cu.

On the other hand, a bottom surface pattern 206 is formed on the bottom surface of the ceramic substrate 200. A heat sink 216 is bonded to the bottom surface pattern 206 by a first step solder 212. The heat sink 216 is covered with electrolytic Ni plating. It should be noted that all of the circuit patterns 202 and 204 and the bottom surface pattern 206 are Cu patterns covered with electroless Ni—P plating (hereinafter referred to simply as "Ni—P plating"). The ceramic substrate 200, the circuit patterns 202 and 204, and the bottom surface pattern 206 are sometimes referred to collectively as the "insulating substrate 208."

Two steps of reflow soldering are required to complete the manufacture of power semiconductor devices having such a configuration. Specifically, the first step solders 210 and 212 are melted in the first reflow soldering step, so that the power semiconductor element 214 and the heat sink 216 are bonded to the circuit patterns 202 and the bottom surface pattern 206, respectively. The second step solder 218, on the other hand, is melted in the second reflow soldering step, so that an electrode terminal 220 inserted into the resin case is bonded to the circuit pattern 204.

It should be noted that the temperature in the second reflow soldering step must be such that the first step solders 210 and 212 do not remelt. The reason is that if the first step solders 210 and 212 remelt in the second reflow soldering step, defects may result such as tilting and displacement of the power semiconductor element 214 and the insulating substrate 208 and run-out of solder. That is, the solidus temperature of the first step solders 210 and 212 must be sufficiently higher than the liquidus temperature of the second step solder 218. The solidus temperature is the temperature at which melted solder completely solidifies on gradual cooling. The liquidus temperature, on the other hand, is the temperature at which solidified solder completely melts on gradual heating. In the above example, the first step solders 210 and 212 have a solidus temperature of 240° C., and the second step solder 218 has a liquidus temperature of 220° C. Therefore, remelting of the first step solders 210 and 212 can be avoided in the second reflow soldering step. (See, for example, Japanese Patent Laid-Open No. 09-181125, No. 10-286689, No. 10-193171, No. 2001-144111, No. 2001-244622, and No. 2009-60101.)

When the first step solders 210 and 212 are made of binary Sn—Sb solder alloy, as in the above example, Ni is likely to diffuse from the Ni—P plating of the circuit pattern 202 and the bottom surface pattern 206 into these solders in the reflow soldering steps. If this Ni diffusion into the first step solders 210 and 212 progresses, then Cu adjacent the Ni—P plating moves into voids left by the diffused Ni. As a result, small gaps called "Kirkendall voids" are formed at the interface between Cu and the Ni—P plating. It has been found that this may lead to peeling of the Ni—P plating due to heat cycles, resulting in degradation of the heat dissipation characteristics of the semiconductor element.

Further, the diffusion of Ni from the Ni—P plating into the solders results in an increase in the P concentration of the Ni—P plating (becoming relatively rich in P). This has resulted in degradation of the bonding reliability of the Ni—P plating.

An example of the diffusion of Ni into solder will be described with reference to FIG. 18. FIG. 18 is a diagram showing profile or contour lines extracted from a cross-sectional SEM image of the area surrounding the interface between the bottom surface Cu pattern and the Ni—P plating thereon, wherein this SEM image was taken after the power semiconductor device was maintained at 175° C. for 200 hours in a high temperature storage evaluation test. FIG. 18 shows that Ni has diffused from the Ni—P plating into the solder resulting in the formation of a gap or void at the interface between the bottom surface Cu pattern and the Ni—P plating due to delamination of the Ni—P plating. Further, the remaining thickness of the Ni—P plating was 0.6 μm, although the original thickness of the Ni—P plating immediately after its formation was 4 μm. Furthermore, the entire portion of the remaining 0.6-μm thick Ni—P plating was richer in P than it was before it was subjected to this high temperature storage evaluation test. Although the diffusion of Ni into solder has been described in connection with the Ni—P plating of the pattern on the bottom surface of the insulating substrate, it is to be understood that the same problem also occurs with the Ni—P plating of the patterns on the top surface of the insulating substrate.

It will be noted that the thinner the Ni—P plating, the greater the decrease in its bonding reliability due to the problem of Ni diffusion described above. In order to avoid an excessive decrease in the bonding reliability of the Ni—P plating, the Ni—P plating may be formed to a thickness of approximately 5 μm, although its typical thickness is approximately 2 μm. However, an increase in the thickness of the Ni—P plating may result in a reduction in the productivity of the plating process performed by the manufacturer of the insulating substrate, as well as an increase in the cost of the insulating substrate. Further, it has been found that increasing the thickness of the Ni—P plating alone may not be sufficient to achieve a high level of reliability. That is, the above reliability problem is not fundamentally solved by increasing the thickness of the Ni—P plating.

SUMMARY OF THE INVENTION

The present invention has been made to solve the foregoing problems. It is, therefore, an object of the present invention to provide a power semiconductor device in which the Ni—P plating of the circuit patterns, etc. is not thick but the diffusion of Ni from the plating into the solders is reduced, and which has high reliability and can be manufactured with high yield.

The present invention also provides a method of manufacturing such a power semiconductor device.

According to one aspect of the present invention, a power semiconductor device includes a substrate, an element circuit pattern formed on the substrate and made of Cu covered with an electroless Ni—P plating layer, and a power semiconductor element bonded to the element circuit pattern by a solder, wherein the solder is an alloy of Sn, Sb, and Cu, and the weight percent of Cu is in the range of 0.5 to 1%, inclusive.

According to another aspect of the present invention, a power semiconductor device includes a substrate, a circuit pattern which is an unplated Cu pattern formed on the substrate, a power semiconductor element bonded to the circuit pattern by a solder made of an alloy of Sn, Sb, and Cu, a terminal circuit pattern formed on the substrate, and a terminal bonded to the terminal circuit pattern by a terminal solder made of an Sn—Ag-based or Sn—Ag—Cu-based unleaded solder, wherein the weight percent of Cu in the solder is in the range of 0.5 to 1%, inclusive, and the solder has a solidus temperature in the range of 235° to 238° C., inclusive, and wherein the terminal solder has a liquidus temperature in the range of 215° to 220° C., inclusive.

According to another aspect of the present invention, a method of manufacturing a power semiconductor device, includes providing a substrate having an element circuit pattern and a terminal circuit pattern formed on a top surface of the substrate, the element circuit pattern and the terminal circuit pattern being made of Cu covered with an Ni—P plating layer, applying a first solder to the element circuit pattern, mounting a power semiconductor element on the first solder, performing a first reflow process to melt the first solder so that the power semiconductor element is bonded to the element circuit pattern by the first solder, applying a second solder to the terminal circuit pattern, mounting a terminal on the second solder, and performing a second reflow process to melt the second solder so that the terminal is bonded to the terminal circuit pattern by the second solder, wherein the first solder is an alloy of Sn, Sb, and Cu, wherein the weight percent of Sn in the alloy is in the range of 91 to 93%, inclusive, the weight percent of Sb in the alloy is in the range of 6.5 to 8%, inclusive, and the weight percent of Cu in the alloy is in the range of 0.5 to 1%, inclusive, wherein the second solder is an Sn—Ag-based or Sn—Ag—Cu-based unleaded solder having a liquidus temperature in the range of 215° to 220° C., inclusive, and wherein the second reflow process is performed at a temperature lower than 235° C.

Other and further objects, features and advantages of the invention will appear more fully from the following description.

BRIEF DESCRIPTION OF THE DRAWINGS

FIG. 12 shows that the results of a study of the solidus temperatures, liquidus temperatures, and melt percents;

DETAILED DESCRIPTION OF THE PREFERRED EMBODIMENT

Embodiment

Figure 1:
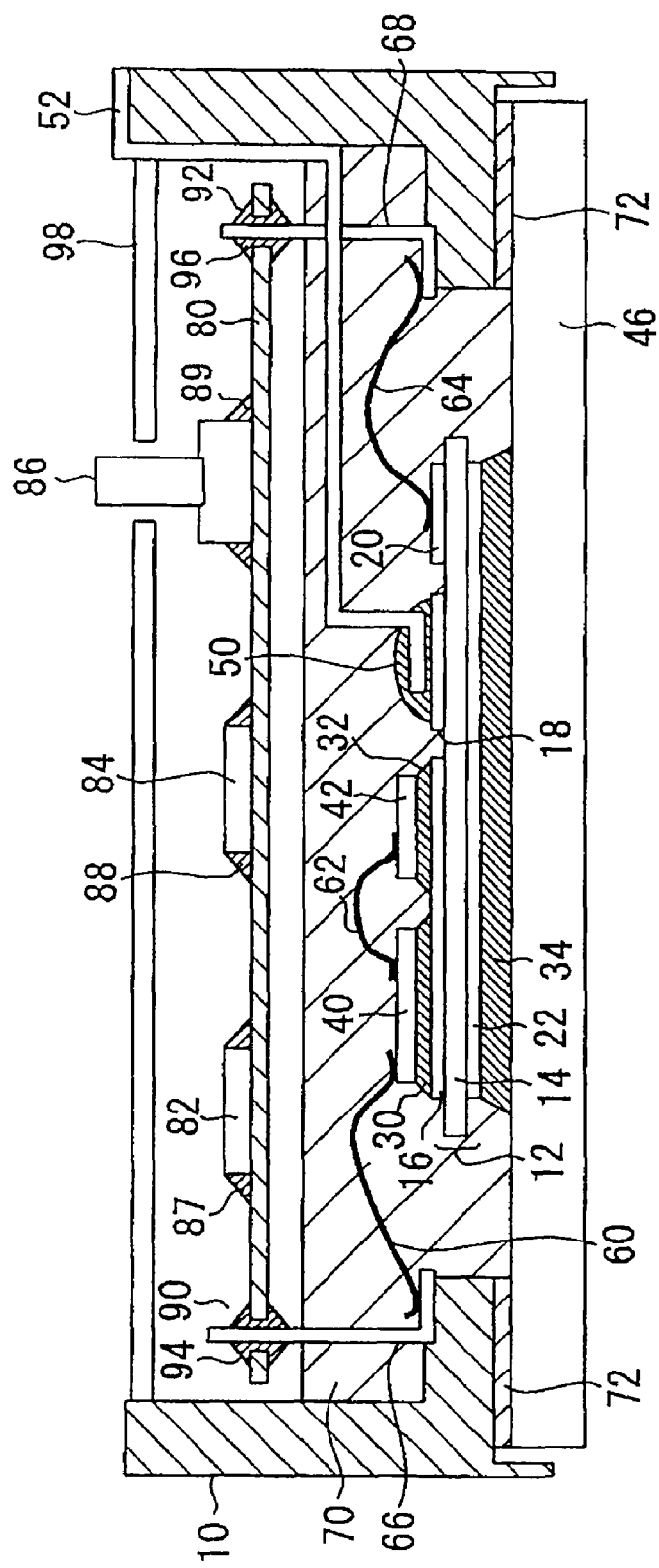
FIG. 1 is a cross-sectional view of a power semiconductor device of the embodiment.

An embodiment of the present invention will be described with reference to FIGS. 1 to 16. It should be noted that certain of the same or corresponding components are designated by the same reference numerals even in different figures and described only once. FIG. 1 is a cross-sectional view of a power semiconductor device of the present embodiment. The configuration of this power semiconductor device will be described with reference to FIG. 1.

The power semiconductor device of the present embodiment includes power semiconductor elements 40 and 42, etc. packaged in a resin case 10. These power semiconductor elements 40 and 42 are fixedly mounted on a heat conducting and insulating ceramic substrate 14. Circuit patterns 16, 18, and 20 are formed on the ceramic substrate 14. The circuit pattern 16 is an element circuit pattern to which elements are bonded, and the circuit patterns 18 and 20 are terminal circuit patterns to which a terminal is bonded. The circuit patterns 16, 18, 20 are made up of a Cu pattern covered with an Ni—P plating layer.

The power semiconductor elements 40 and 42 are bonded to the circuit pattern 16 by first solders 30 and 32, respectively. For example, the power semiconductor elements 40 and 42 may be, but are not limited to, an IGBT and an FWDi. The first solders 30 and 32 have a composition of 92.4 wt % Sn-7 wt % Sb-0.6 wt % Cu, where wt % is the abbreviation for weight percent. It should be noted that the symbol "wt %" may be omitted for convenience of description. Further, in the case of the composition of the first solders 30 and 32, for example, the determination of the weight percents of Sb and Cu determines the weight percent of Sn. Therefore, the indication of the weight percent of Sn may be omitted. For example, the composition of these solders may be represented as Sn-7Sb-0.6Cu instead of 92.4 wt % Sn-7 wt % Sb-0.6 wt % Cu. Further, for example, the expression "a Cu content of 5%" means a Cu content of 5 weight percent (or wt %).

An electrode terminal 52 is bonded to the circuit pattern 18 by a second solder 50. The second solder 50 has a composition of Sn-3Ag-0.5Cu. The electrode terminal 52 is used to connect the power semiconductor device to an external device or component. The electrode terminal 52 is insert molded into the resin case 10.

The circuit pattern 20 is electrically connected to a signal terminal 68 by an aluminum wire 64. Further, an aluminum wire 60 is connected to the top surface of the power semiconductor element 40, and an aluminum wire 62 is connected at one end to the top surface of the power semiconductor element 40 and at the other end to the top surface of the power semiconductor element 42. The power semiconductor device 40 is electrically connected to a signal terminal 66 by the aluminum wire 60. The signal terminals 66 and 68 are used to supply a control signal, etc. to the power semiconductor elements. These signal terminals 66 and 68 are insert molded into the resin case 10.

On the other hand, a bottom surface pattern 22 is formed on the bottom surface of the ceramic substrate. The bottom surface pattern 22 is made up of a Cu pattern covered with Ni—P plating. It should be noted that active brazing may be used to bond the Cu patterns of the circuit patterns 16, 18, and 20 to the top surface of the ceramic substrate 14 and to bond the Cu pattern of the bottom surface pattern 22 to the bottom surface of the substrate. A heat sink 46 is bonded to the bottom surface pattern 22 by a first solder 34. The heat sink 46 is made, e.g., of a material having high heat conductivity, such as Cu. The entire surfaces of the heat sink 46 are treated and covered with an electrolytic Ni plating (commonly called "Ni electroplating") approximately 5 μm thick. Ni diffusion is less likely to take place from electrolytic Ni plating than from Ni—P plating, and electrolytic Ni plating can be formed at low cost. Further, electrolytic Ni plating is immune to the problem of P concentration increase associated with Ni—P plating described above, since electrolytic Ni plating does not contain P. However, electrolytic Ni plating is not applied to the circuit patterns 16, 18, and 20 for the following reason. In practice, electrolytic Ni plating, due to its principle, is only applied to a single separate piece of metal. That is, it is difficult to apply electrolytic Ni plating to these circuit patterns 16, 18, and 20, since they are spaced from one another like islands and, furthermore, are separated from the bottom surface pattern by the ceramic substrate. Thus, electrolytic Ni plating (or Ni electroplating) cannot produce satisfactory results when applied to separate circuit patterns, and therefore chemical electroless Ni—P plating is used instead. It should be noted that P (phosphorous) in the Ni—P plating serves to maintain the plating film quality. The heat sink 46 configured as described above is adhered to the resin case 10 by adhesive 72.

The resin case 10 is filled to a predetermined level with a sealing gel 70 to protect the power semiconductor elements 40 and 42 and the aluminum wires 60, 62, and 64 from dust and foreign matter and to improve the insulation of the components within the case. A control substrate 80 is disposed within the resin case 10 and spaced from the sealing gel 70. The control substrate 80 has through-holes 90 and 92. The signal terminals 66 and 68 are inserted into the through-holes 90 and 92, respectively, and bonded and electrically connected thereto by solders 94 and 96, respectively. Electronic components 82 and 84 are bonded to the control substrate 80 by solders 87 and 88, respectively. Further, an external connection socket 86 is also connected to the control substrate 80 by a solder 89. A cover 98 having an opening is disposed so as to expose the external connection socket 86 to the outside.

It should be noted that the Ni—P plating of the circuit patterns 16, 18, and 20 and the bottom surface pattern 22 is electroless plating approximately 2 μm thick. This Ni—P plating serves to improve the soldering properties of these patterns, etc.

Figure 2:
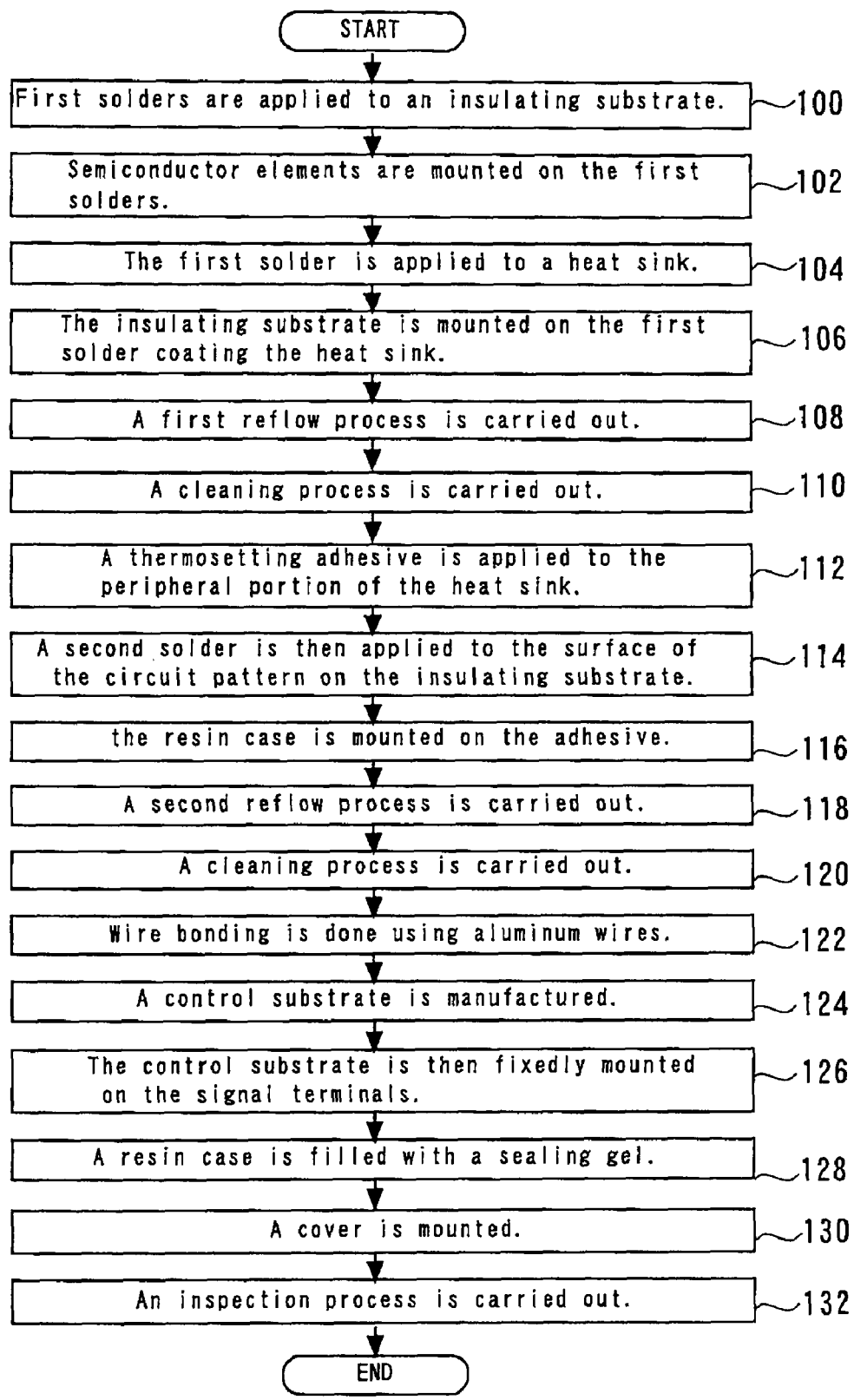
FIG. 2 is a flowchart illustrating the method of manufacturing the power semiconductor device according to the embodiment.
Figure 3:
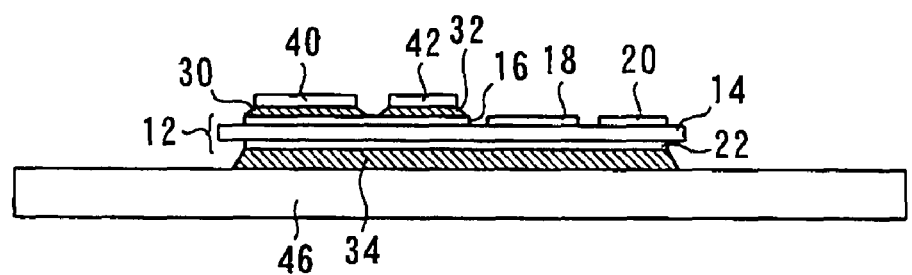
FIG. 3 shows that the power semiconductor device after the first reflow process.

This completes the description of the configuration of the power semiconductor device of the present embodiment. A method of manufacturing this power semiconductor device will now be described with reference to FIG. 2. FIG. 2 is a flowchart illustrating this method of manufacturing the power semiconductor device according to the present embodiment.

First, first solders 30 and 32 are applied to an insulating substrate 12 in step 100. As described above, the insulating substrate 12 has formed thereon circuit patterns 16, 18, and 20 and a bottom surface pattern 22. Next, power semiconductor elements 40 and 42 are mounted on the first solders 30 and 32, respectively, in step 102. A first solder 34 is then applied to a heat sink 46 in step 104. Then in step 106, the insulating substrate 12 is mounted on the first solder 34 coating the heat sink 46.

Next, in step 108, a first reflow process is carried out to effect soldering. Specifically, in the first reflow process, the first solders 30, 32, and 34 are melted within a reflow heating chamber to solder the power semiconductor elements 40 and 42 and the heat sink 46 to the insulating substrate 12. The result of step 108 is the structure shown in FIG. 3. That is, the power semiconductor device 40 is bonded to the circuit pattern 16 by the first solder 30, and the power semiconductor device 42 is bonded to the circuit pattern 16 by the first solder 32. Further, the heat sink 46 is bonded to the bottom surface pattern 22 by the first solder 34. After the completion of step 108, a cleaning process is carried out in step 110.

Then in step 112, a thermosetting adhesive 72 is applied to the peripheral portion of the heat sink 46. The adhesive 72 is used to bond a resin case 10 (described later) to the heat sink 46. A second solder 50 is then applied to the surface of the circuit pattern 18 on the insulating substrate 12 in step 114. Then in step 116, the resin case 10 is mounted on the adhesive 72. Specifically, this resin case 10 has inserted therein an electrode terminal 52 and signal terminals 66 and 68, and the mounting of the resin case 10 in step 116 is such that one end of the electrode terminal 52 is located above the circuit pattern 18 coated with the second solder 50. Although the resin case 10 is adhered to the heat sink 46 by the adhesive 72, they may be screwed together to more rigidly secure them together.

Then in step 118, a second reflow process is carried out to effect soldering and cure the adhesive 72. Specifically, in the second reflow process, the second solder 50 is melted within a reflow heating chamber to bond the electrode terminal 52 to the circuit pattern 18. The second solder 50 is made of Sn-3Ag-0.5Cu alloy having a solidus temperature of 217° C. and a liquidus temperature of 220° C. This means that the minimum temperature required in the second reflow process is 220° C. In reality, however, the second reflow process is carried out at 230° C. to completely melt the second solder 50. Incidentally, the first solders 30, 32, and 34 are made of Sn-7Sb-0.6Cu alloy having a solidus temperature of 237° C. and a liquidus temperature of 242° C., as described in detail later. Therefore, the first solders 30, 32, and 34 do not remelt in the second reflow process.

Figure 4:
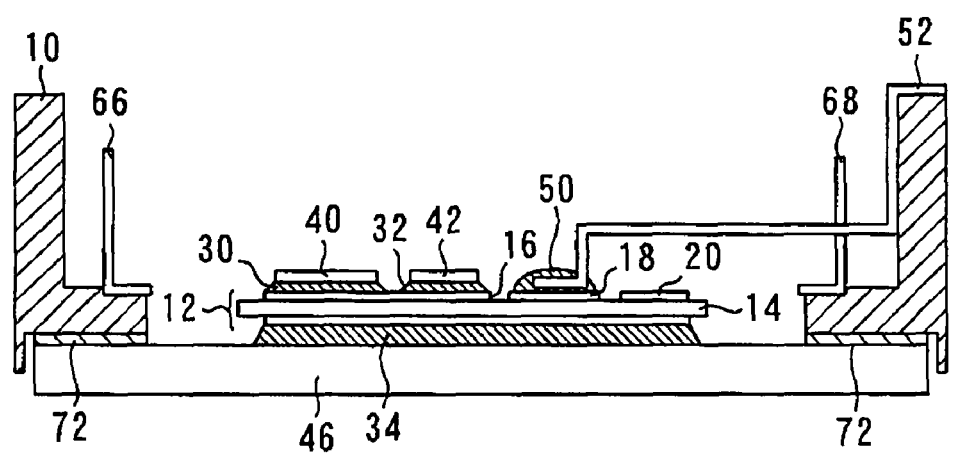
FIG. 4 shows that the power semiconductor device after the second reflow process.
Figure 5:
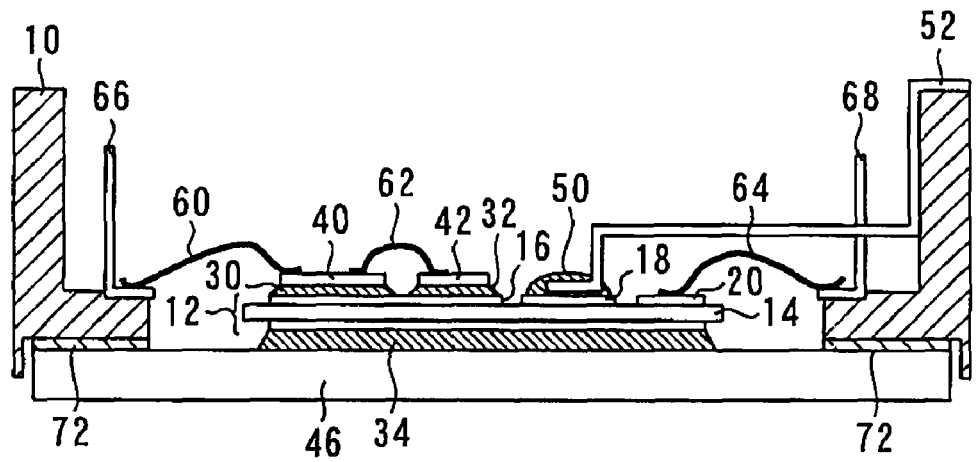
FIG. 5 shows that the power semiconductor device after the wire bonding.

The result of step 118 is the structure shown in FIG. 4. That is, the electrode terminal 52 is bonded to the circuit pattern 18 by the second solder 50. Further, the resin case 10 is secured to the heat sink 46 by the adhesive 72 and, when necessary, by screws. After the completion of step 118, a cleaning process is carried out in step 120.

Then in step 122, wire bonding is done using aluminum wires. The result of step 122 is the structure shown in FIG. 5.

That is, the signal terminal 66 is electrically connected to the power semiconductor element 40 by an aluminum wire 60. The power semiconductor element 40 is also electrically connected to the power semiconductor element 42 by an aluminum wire 62. The signal terminal 68 is electrically connected to the circuit pattern 20 by an aluminum wire 64.

Figure 6:
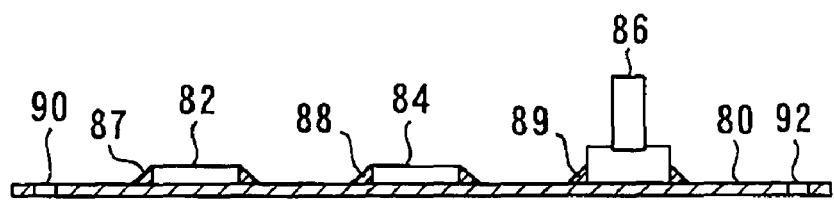
FIG. 6 shows that the structure of the control substrate.

Then in step 124, a control substrate 80 shown in FIG. 6 is manufactured. This control substrate has the structure shown in FIG. 6, which is a plan view. The control substrate 80 has through-holes 90 and 92. An electronic component 82 is bonded to the control substrate 80 by a solder 87. Likewise, an electronic component 84 is bonded to the substrate 80 by a solder 88. Further, an external connection socket 86 is bonded to the substrate 80 by a solder 89. The control substrate 80 is then fixedly mounted on the signal terminals 66 and 68 in step 126.

Figure 7:
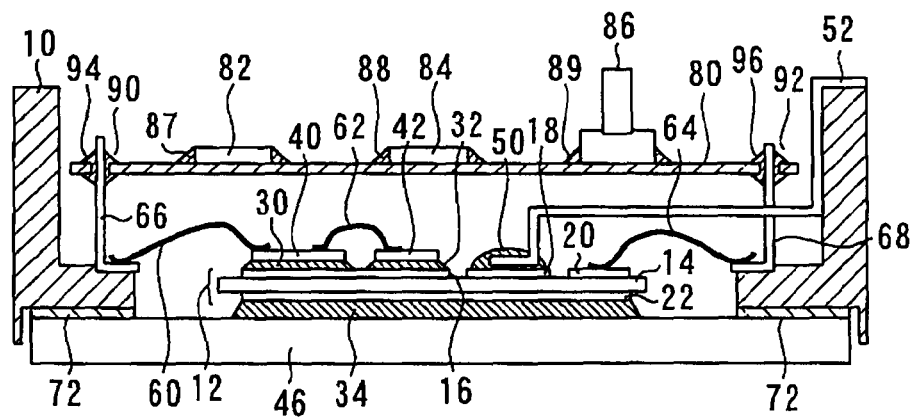
FIG. 7 is a diagram illustrating the way in which the control substrate is secured to the signal terminals.

FIG. 7 is a diagram illustrating the way in which the control substrate 80 is secured to the signal terminals 66 and 68. As shown in FIG. 7, the signal terminals 66 and 68 are inserted into the through-holes 90 and 92, respectively, of the control substrate 80. The signal terminals 66 and 68 are then bonded to the control substrate 80 by solders 94 and 96, respectively. This soldering is done by spot heating using a relatively low melting point solder having a liquidus temperature of approximately 210° C. Therefore, there is no possibility of the first solders 30, 32, and 34 and the second solder 50 remelting in step 126.

The resin case 10 is then filled with a sealing gel 70 in step 128. A necessary curing process is subsequently carried out. It should be noted that the temperature at which the sealing gel 70 is cured is lower than the remelting temperatures of all the solders described above. A cover 98 is then mounted in step 130. Then in step 132, an inspection process is carried out to detect defective products. This completes the manufacture of the power semiconductor device of the present embodiment shown in FIG. 1.

The advantages of the present embodiment will now be described including those resulting from the fact that the first solders 30, 32, and 34 are made of 92.4Sn-7Sb-0.6Cu alloy. The power semiconductor device of the present embodiment has the following superior features: prevention of remelting of the first solders, prevention of Ni diffusion, reduction of the melt percent, improved soldering properties, and improved mechanical characteristics. Each of these features will be discussed separately below.

The feature "prevention of remelting of the first solders" will now be described. In the manufacture of the power semiconductor device of the present embodiment, remelting of the first solders 30, 32, and 34 can be avoided when the second solder 50 is melted in the second reflow process. Specifically, in order that the first solders 30, 32, and 34 do not remelt in the second reflow process, these first solders must have a solidus temperature at least 15° C. higher than the liquidus temperature of the second solder 50. The difference between the solidus temperature of the first solders 30, 32, and 34 and the liquidus temperature of the second solder 50 is hereinafter referred to as the "inter-solder temperature difference."

Figure 8:
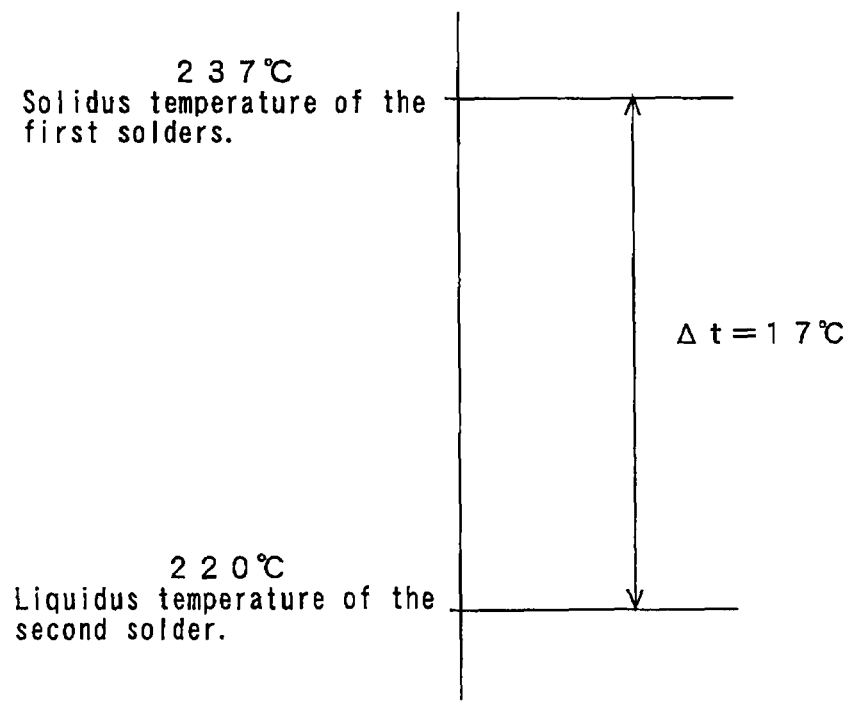
FIG. 8 shows inter-solder temperature difference.
Figure 9:
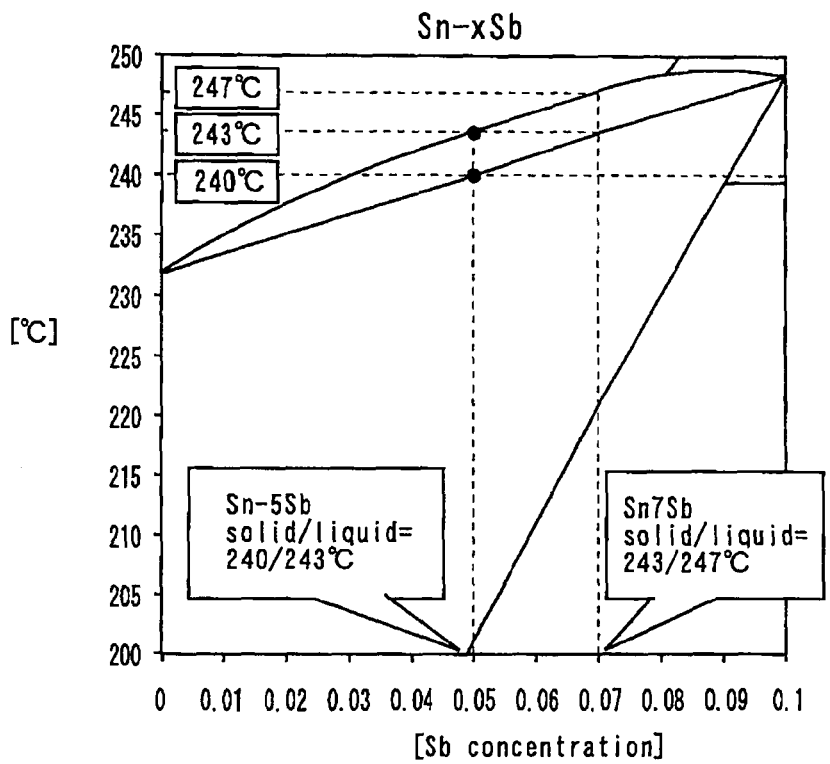
FIG. 9 is a phase diagram of the Sn-xSb solder alloy.
Figure 10:
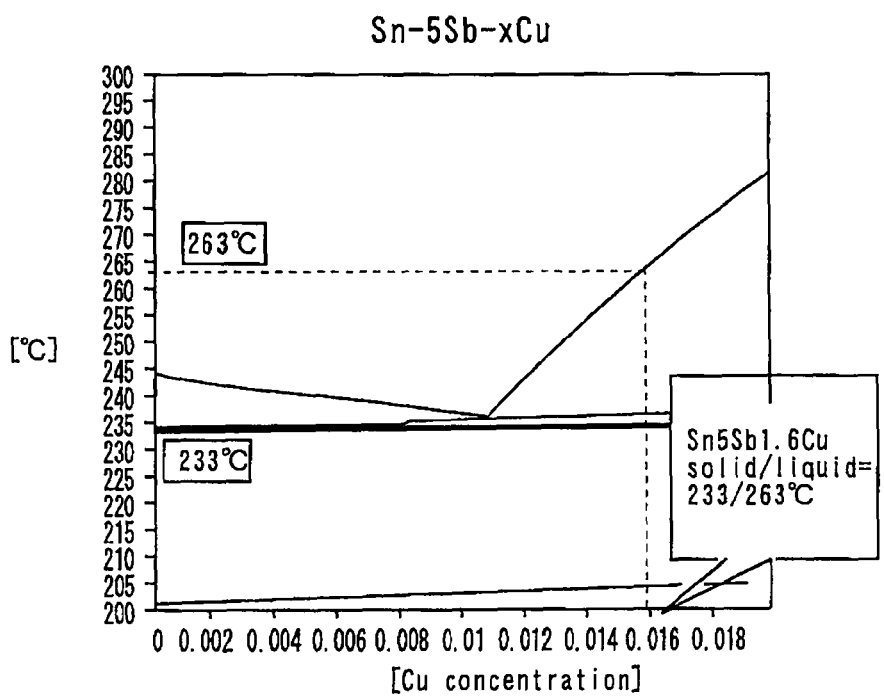
FIG. 10 is a phase diagram of the Sn-5Sb alloy containing Cu.

The reason that the inter-solder temperature difference must be 15° C. or more is as follows. In the second reflow process, the second solder 50 is heated to a temperature 10° C. higher than its liquidus temperature in order to completely melt the second solder 50. In order to ensure that the first solders 30, 32, and 34 do not melt in the second reflow process, the material of the first solders 30, 32, and 34 must be selected to have a solidus temperature which exceeds the above heated temperature of the second solder 50 by approximately 5° C. (a margin). That is, the inter-solder temperature difference must be 15° C. (i.e., 10° C. plus 5° C.) or more. In the present embodiment, the first solders have a solidus temperature of 237° C. and the second solder has a liquidus temperature of 220° C. Therefore, the inter-solder temperature difference is 17° C., which is greater than the required inter-solder temperature difference (15° C.). This is schematically shown in FIG. 8. Thus, in the manufacture of the power semiconductor device of the present embodiment, remelting of the first solders 30, 32, and 34 can be avoided, thereby preventing defects such as tilting and displacement of the power semiconductor elements 40 and 42 and the insulating substrate 12 and run-out of solder.

The feature "prevention of Ni diffusion" will now be described. In the power semiconductor device of the present embodiment, the diffusion of Ni from the Ni—P plating of the circuit patterns 16, 18, and 20 into the solders is reduced, although the Ni—P plating not thick. This prevents peeling of the Ni—P plating, as well as preventing an increase in the P concentration of the Ni—P plating and the resulting degradation of the bonding reliability of the Ni—P plating. This is accomplished by the fact that the first solders 30, 32, and 34 of the present embodiment contain Cu. More specifically, since the first solders 30, 32, and 34 contain Cu, a compound layer of Cu—Sn—Ni is formed at the interface between the Ni—P plating layer and the first solders 30, 32, and 34 when these solders are melted. This Cu—Sn—Ni compound layer acts as a barrier layer to prevent the diffusion of Ni from the Ni—P plating layer into the first solders 30, 32, and 34. This effect is referred to herein as the "Ni diffusion preventing effect."

Figures 15, 16:
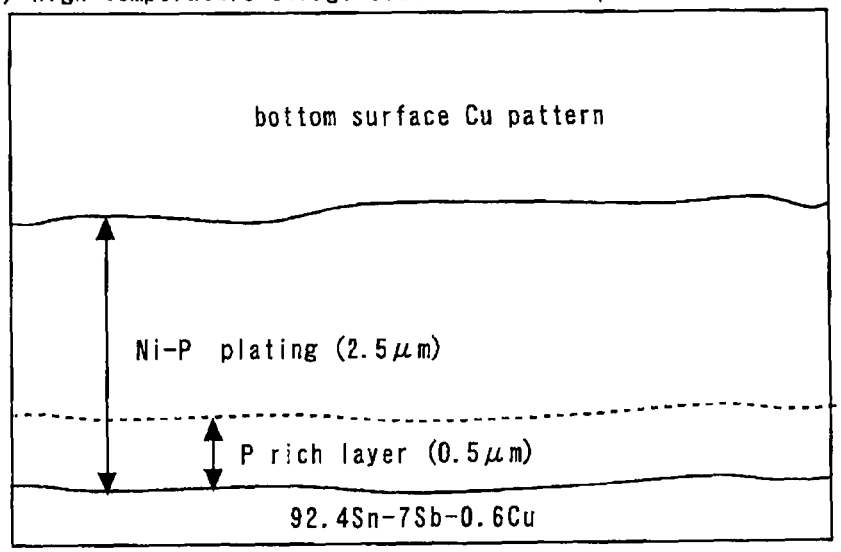
FIG. 15 shows the results of experiments on the dissolution of Ni—P plating electrodes.
FIG. 16 shows profile or contour lines extracted from a cross-sectional SEM image of the area surrounding the interface between the bottom surface Cu pattern and the Ni—P plating thereon in the power semiconductor device after the high temperature storage evaluation test.
Figure 17:
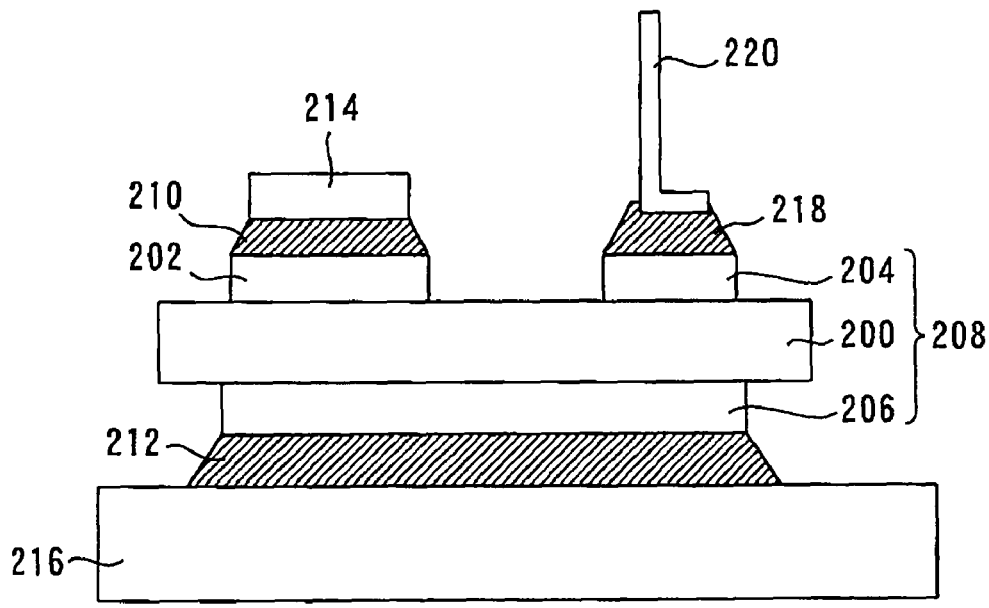
FIG. 17 shows the exemplary power semiconductor device.
Figure 18:
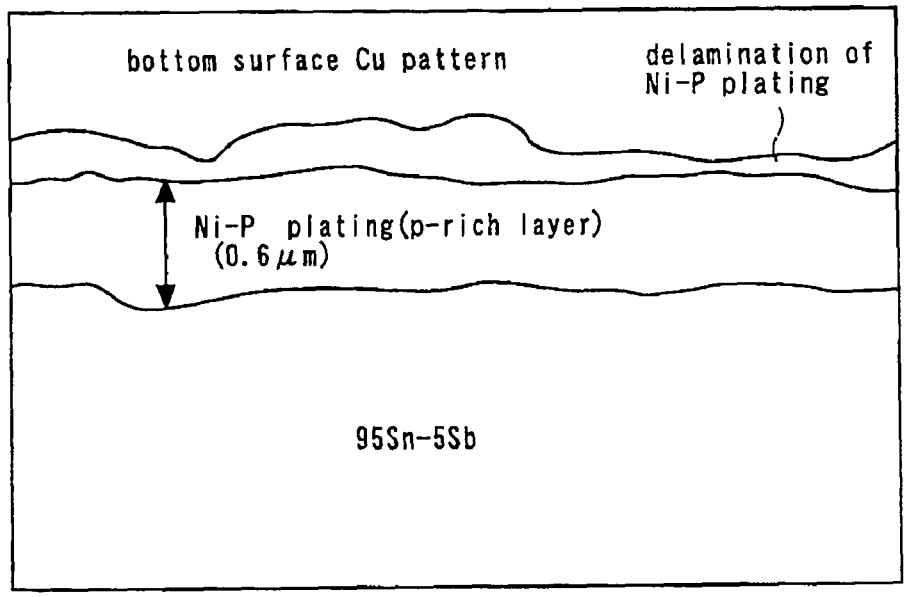
FIG. 18 shows the exemplary power semiconductor device.

The Cu content required to produce the Ni diffusion preventing effect will be described with reference to FIG. 15. FIG. 15 shows the results of experiments on the dissolution of Ni—P plating electrodes (corresponding to the Ni—P plating described above) due to the application of solder thereto. The initial thickness of the Ni—P plating electrodes was 1.7 μm. The solders indicated in the Solder Alloy Composition column of the table shown in FIG. 15 were applied to these Ni—P plating electrodes. This application of solder (or soldering) was carried out in a reflow process; specifically, the temperature in the reflow process was maintained at 240° C. or higher for 8 min and 30 sec and at 280° C. or higher for 6 min and 30 sec, with the peak temperature being 297° C. After the application of solder to the electrodes, the cross-sectional structures of the junction portions were observed under SEM at a magnification of 2000 times to observe the conditions of interface portions (20 mm long). Three locations along the interface were imaged, where each location exhibited a typical Ni dissolution state. The remaining Ni film thickness at each location was measured. FIG. 15 shows the measurement results. FIG. 15 indicates that the Ni dissolution can be reduced to a satisfactory level when the Cu content is 0.5% or more. When the Cu content was 0.3% or less, on the other hand, the Ni dissolution was not sufficiently reduced. In the case where solder alloy of Sn-7Sb-xCu (where x is any number) was applied to an Ni—P plating electrode, when the Cu content was 0.3% or less, the Ni—P plating electrode, whose initial thickness was 1.7 μm, suffered a penetration due to Ni dissolution. On the other hand, when the Cu content in the same alloy was 0.5-1%, even the thinnest portion of the remaining Ni—P plating electrode had a thickness of 0.5 μm. In the case where solder alloy of Sn-5Sb-xCu was applied to an Ni—P plating electrode, when the Cu content was 3% or less, the Ni—P plating electrode also suffered a penetration due to Ni dissolution. On the other hand, when the Cu content was 0.5% or more, even the thinnest portion of the remaining Ni—P plating electrode had a thickness of 0.4 μm. Thus, the diffusion of Ni from the Ni—P plating into the solder is dictated by the Cu content of the solder, not by the Sb content of the solder. It will be seen from the above considerations that in order to achieve the Ni diffusion preventing effect, the Cu content of the solder must be 0.5% or more. In the present embodiment, the first solders 30, 32, and 34 are made of Sn-7Sb-0.6Cu alloy, which allows for the Ni diffusion preventing effect.

The improvement in the reliability of the power semiconductor device due to the Ni diffusion preventing effect will be described with reference to FIG. 16. FIG. 16 shows profile or contour lines extracted from a cross-sectional SEM image of the area surrounding the interface between the bottom surface Cu pattern and the Ni—P plating thereon in the power semiconductor device of the present embodiment, wherein this SEM image was taken after the power semiconductor device was maintained at 175° C. for 1000 hours in a high temperature storage evaluation test. It should be noted that this temperature (175° C.) is higher than the temperature for ordinary reliability tests of such devices, allowing for a severer reliability evaluation test. The reason for the selection of the high temperature storage evaluation test for the reliability evaluation is that repeating a few min. heat cycle of between high and low temperatures, e.g., −40° C. and 125° C., was found to fail to provide sufficient heat history for reliability evaluation. As can be seen from FIG. 16, there was no peeling of the Ni—P plating from the Cu pattern of the bottom surface pattern 22. Further, the remaining thickness of the Ni—P plating was large (namely, 2.5 μm), although the device had been subjected to 1000 hours of the evaluation test. Furthermore, the formed P rich layer had a thickness of only 0.5 μm, which was found by element mapping analysis. Further, observation of an ultrasonic analysis image, which observation was made together with that of the cross-sectional SEM image, revealed that no whitening had taken place. In this way the device construction of the present embodiment can provide very high reliability, as described above. Therefore, it is not necessary to increase the thickness of the Ni—P plating layers in the device. The effect described above can be obtained if the Ni—P plating layers have a thickness of approximately 2-3 μm.

The feature "reduction of the melt percent" will now be described. As described above, in order to avoid remelting of the first solders, the inter-solder temperature difference must be 15° C. or more. Further, the first solders 30, 32, and 34 must contain Cu in order to provide the Ni diffusion preventing effect. When the second solder 50 has a composition of Sn-3Ag-0.5Cu, the solidus temperature of the first solders 30, 32, and 34 must be 235° C. or more. It is easy to produce a binary Sn—Sb solder alloy having a solidus temperature of 235° C. or more, as shown in the phase or equilibrium diagram of FIG. 9. It should be noted that in FIG. 9, etc., the expression "solid/liquid" means "solidus temperature/liquidus temperature." On other hand, Sn-5Sb alloy containing Cu (represented as Sn-5Sb-xCu in FIG. 10) has a solidus temperature of approximately 233° C., regardless of the Cu concentration, as shown in the phase diagram of FIG. 10. Therefore, the use of Sn-5Sb alloy containing Cu cannot provide the required inter-solder temperature difference.

Figure 11:
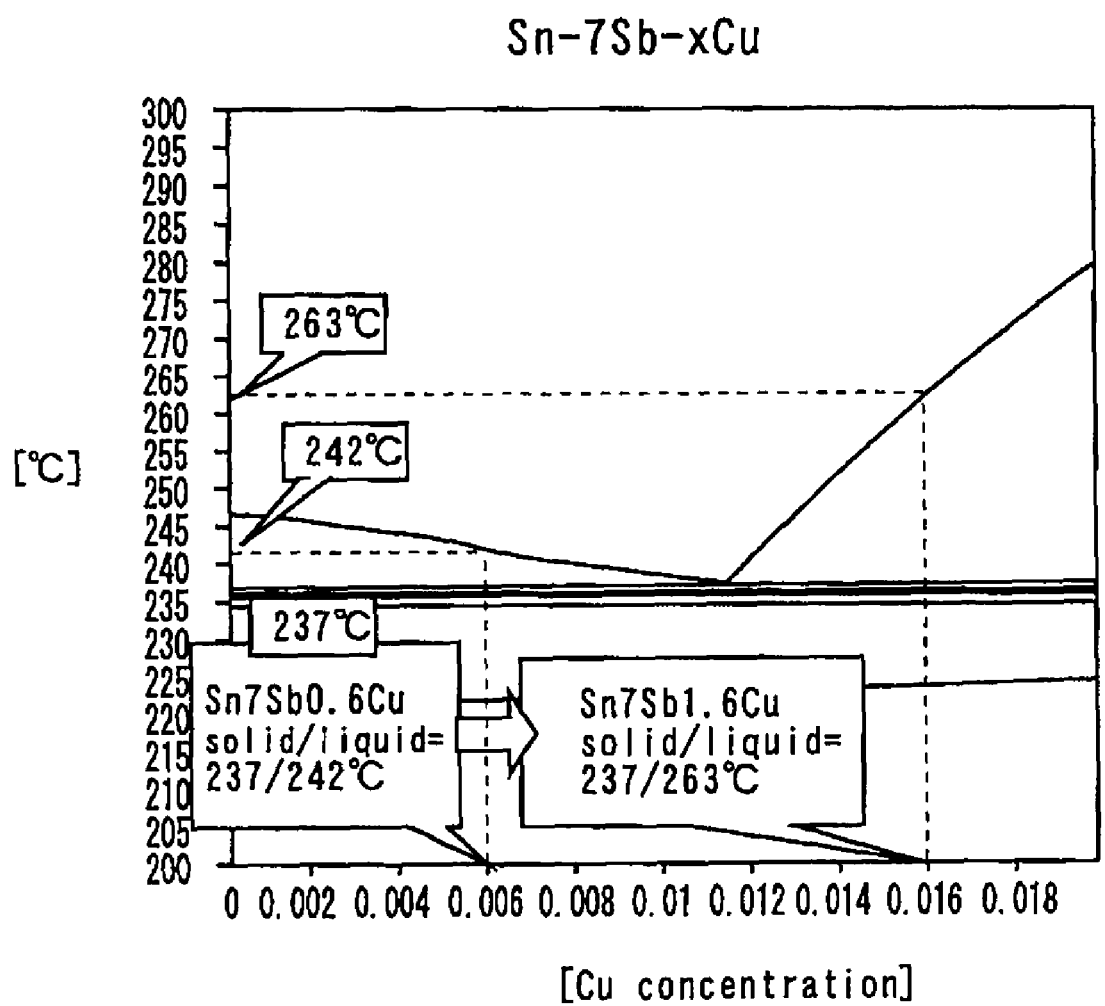
FIG. 11 is a phase diagram of the Sn-7Sb alloy containing Cu.

Sn-7Sb alloy containing Cu (represented as Sn-7Sb-xCu in FIG. 11), on the other hand, has a solidus temperature of approximately 237° C., regardless of the Cu concentration, as shown in the phase diagram of FIG. 11. Therefore, the use of this solder alloy can provide an inter-solder temperature difference of 15° C. or more.

FIG. 12 shows results of a study of the solidus temperatures, liquidus temperatures, and melt percents at 237° C. of SnSbCu-based alloys having different compositions. It should be noted that the term "melt percent," as used herein, refers to the ratio of the amount of heat absorbed by a substance when the substance is heated to a given temperature in DSC (Differential Scanning calorimetry), relative to the total amount of heat absorbed by the same substance when it is heated in DSC until it completely melts. The above study, made in connection with the present embodiment, lists the melt percents of alloys at 237° C.

The molten state of solder around its solidus temperature can be determined by measuring its melt percent. That is, for example, when Sn-5Sb alloy having a solidus temperature of 240° C. is heated to 237° C. in DSC, the alloy absorbs a slight amount of heat (that is, an endothermic reaction of the solder alloy has already started, although it has a solidus temperature of 240° C.). In this state, a very small inside portion of the alloy is in a liquid state (that is, the alloy has already started to melt), although the solder alloy is substantially in a solid state. The melt percent of Sn-5Sb-0.6Cu alloy as measured in DSC, on the other hand, is as much as 65% at the same temperature of 237° C. On the other hand, the material of the first solders 30, 32, and 34 must be selected to have a sufficiently low melt percent at 237° C. to avoid remelting of these solders. Practically, in order to avoid remelting of the first solders 30, 32, and 34, the material of these solders should preferably have a melt percent of 10% or less at 237° C. Judging from FIG. 12, the Sb content is preferably 6.5% or more to ensure that the melt percent is 10% or less. Further, the Sb content is more preferably 7% or more, in which case the melt percent is 3% or less. The first solders 30, 32, and 34 of the present embodiment exhibit a sufficiently low melt percent even at 237° C., since they are made of Sn-7Sb-0.6Cu alloy.

The feature "improved soldering properties" will now be described. The closer the liquidus temperature of solder to the solidus temperature, the better the soldering properties of the solder. Specifically, the greater the difference between the solidus temperature and the liquidus temperature of the solder, the wider the melting temperature region and hence the more likely it is that shrinkage cavities will be formed in the solder during the solidification and shrinkage of the solder, and more likely it is that small cracks will be formed in the solder due to the difference in coefficient of linear expansion between the solder and the member to which the solder is applied (e.g., an insulating substrate or heat sink).

Therefore, let us focus our attention on the difference between the solidus and liquidus temperatures of each solder alloy composition shown in FIG. 12. When the Cu content is 0.6%, the increase in the Sb content from 7% to 8% results in only a 4° C. increase in the liquidus temperature. However, the increase in the Sb content from 8% to 9% results in as much as a 9° C. increase in the liquidus temperature when the Cu content is 0.6%. This indicates that the liquidus temperature changes greatly with change of the Sb content when the Sb content exceeds 8%. The Sb content should preferably be 8% or less for process stabilization even if the soldering temperature can be set relatively high by use of appropriate equipment, taking into account the above considerations. On the other hand, when the Sb content is 7%, if the Cu content is 1%, the liquidus temperature is 238° C. or less, which is advantageous for soldering. However, when the Cu content exceeds 1%, the liquidus temperature rises rapidly with increasing Cu content. For example, when the Cu content is 2%, the liquidus temperature is 280° C. Therefore, the Cu content must be strictly controlled so as not to exceed 1% in order to prevent an excessive increase in the liquidus temperature. Further, the dependence of the liquidus temperature on the Cu content is the same when the Sb content is in the range of 6.5-8%. Therefore, the Cu content must be 1% or less when the Sb content is in this range, as described in connection with the case where the Sb content is 7%. That is, the Sb content is preferably 8% or less and the Cu content is preferably 1% or less in order to achieve improved soldering properties. The first solders 30, 32, and 34 of the present embodiment satisfy this requirement, since they are made of Sn-7Sb-0.6Cu alloy.

Figure 13:
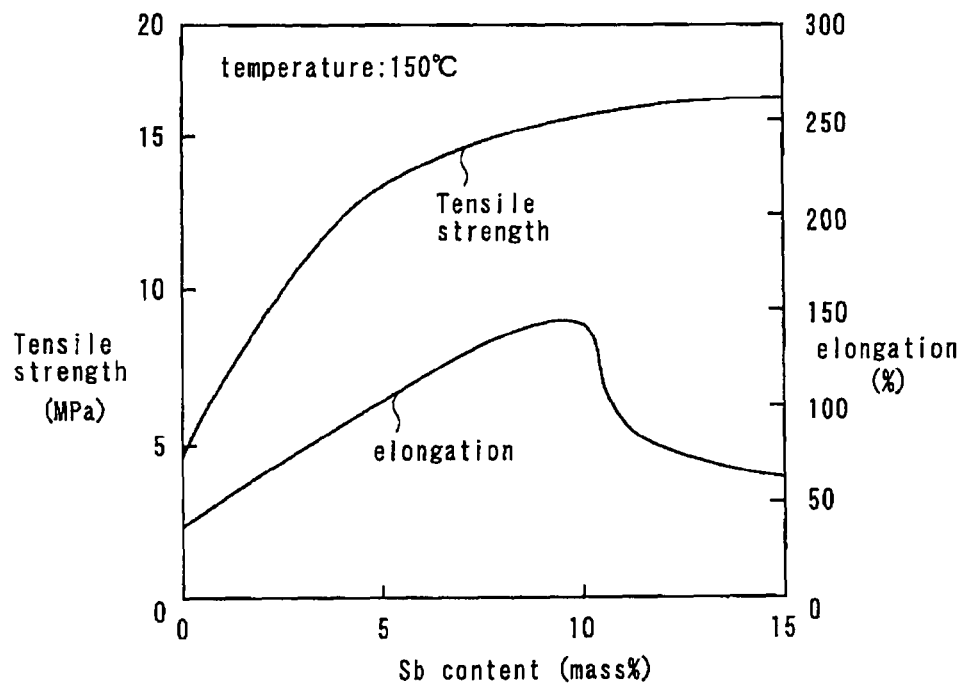
FIG. 13 is a diagram illustrating the tensile characteristics (or strength) and elongation of SnSb alloy as a function of the Sb content.
Figure 14:
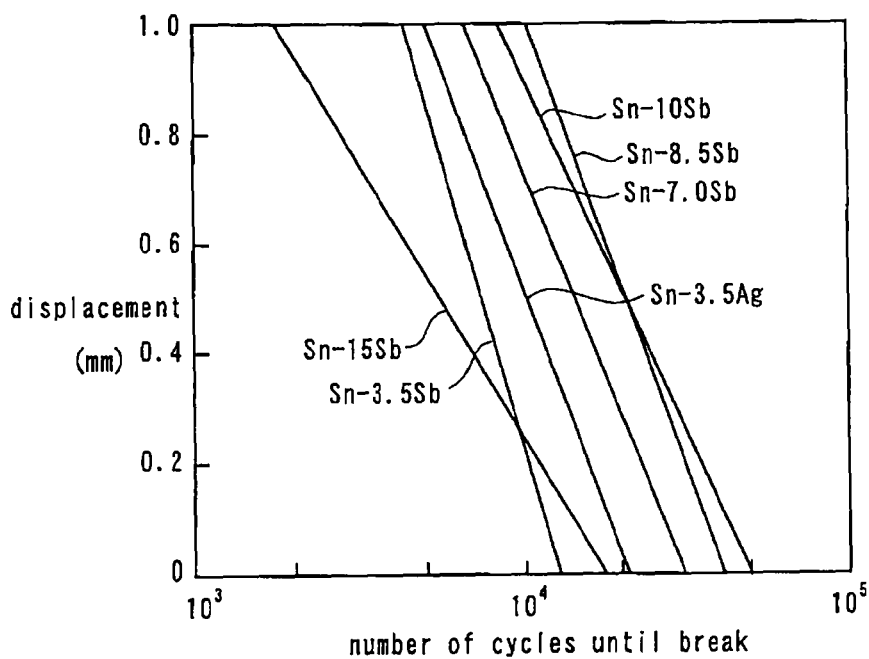
FIG. 14 is a diagram illustrating the low cycle fatigue characteristics of SnSb alloys as a function of the Sb content.

The feature "improved mechanical characteristics" will now be described. FIG. 13 is a diagram illustrating the tensile characteristics (or strength) and elongation of SnSb alloy as a function of the Sb content. Generally, the tensile strength and elongation of SnSb alloy increase with the Sb content. However, as the Sb content exceeds 10%, the elongation of the alloy decreases dramatically. FIG. 14 is a diagram illustrating the low cycle fatigue characteristics of SnSb alloys as a function of the Sb content. For reference purposes, FIG. 14 also shows the low cycle fatigue characteristics of Sn-3.5Ag alloy which is conventionally used. As can be seen from FIG. 14, the SnSb alloys having an Sb content in the range of 7 to 10% have good low-cycle fatigue characteristics, as compared to the Sn-3.5Ag alloy. However, the Sn-15Sb and Sn-3.5Sb alloys have relatively poor low-cycle fatigue characteristics. It will be noted that since the first solders 30, 32, and 34 of the present embodiment are made of Sn-7Sb-0.6Cu alloy, they have great tensile strength and elongation and good low-cycle fatigue characteristics.

Various alterations may be made to the present embodiment. For example, as is clear from the above description, the first solders 30, 32, and 34 are not limited to Sn-7Sb-0.6Cu alloy. In order to produce all the effects described above, it is only necessary that the Sb content be in the range of 6.5 to 8% (more preferably 7 to 8%) and the Cu content be in the range of 0.5 to 1%. It should be noted that these alloy compositions have solidus temperatures of 235°-238° C.

For example, although the second solder 50 has been described as being made of Sn-3Ag-0.5Cu alloy, it is to be understood that the present invention is not limited to this particular composition. The present invention only requires that the second solder 50 be SnAg- or SnAgCu-based unleaded solder having a liquidus temperature in the range of approximately 215° to 220° C.

For example, the heat sink 46 may be unplated (i.e., may not have the electrolyte Ni plating) to reduce parts cost. In this case, in addition to Cu contained in the first solder 34, Cu in the heat sink 46 also contributes to the prevention of peeling of the Ni—P plating (Ni) of the bottom surface pattern 22. Specifically, Cu diffuses from the heat sink 46 into the first solder 34, thereby increasing the Cu content of the first solder 34. The present inventors have found, through experiment, that when the first solders are saturated with Cu, the solders have a Cu content of approximately 1.6%. This is true not only with Sn-7Sb solder containing Cu (e.g., the first solders), but also with Sn-5Sb solder containing Cu. Sn-5Sb alloy containing no Cu (copper) has a solidus temperature of 240° C. and a liquidus temperature of 243° C., whereas Sn-5Sb alloy saturated with Cu (i.e., having a Cu content of 1.6%) has a solidus temperature of 233° C. (which is a 7° C. drop from the solidus temperature of the Sn-5Sb alloy containing no Cu) and a liquidus temperature of 263° C. Further, Sn-7Sb-0.6Cu alloy has a solidus temperature of 237° C. and a liquidus temperature of 242° C., whereas Sn-7Sb alloy saturated with Cu (i.e., having a Cu content of 1.6%) has a solidus temperature of 237° C. and a liquidus temperature of 263° C. This means that the solidus temperature of the first solder 34, whose initial Cu content is 0.6%, remains the same even when its Cu content has become 1.6% (i.e., even when the solder is saturated with Cu). Therefore, the first solder 34 does not remelt in the second reflow process even if the heat sink 46 does not have Ni plating. Likewise, the solidus temperature of the first solders 30, 32, and 34 remains at 237° C. even if the circuit patterns 16, 18, and 20 and the bottom surface pattern 22 do not have Ni—P plating.

For example, although in the present embodiment the circuit patterns 16, 18, and 20 and the bottom surface pattern 22 are made up of a Cu pattern, it is to be understood that the present invention is not limited to this particular material. These patterns may be made of Al instead of Cu while retaining the advantages of the invention. That is, also in the case where the Al circuit patterns and Al bottom surface pattern are covered with an Ni—P plating layer, Ni may diffuse from the Ni—P plating layer into the solders, so that the Ni—P plating layer may peel. The present invention can also prevent such Ni diffusion.

The present invention enables the manufacture of a low cost yet highly reliable power semiconductor device with high yield.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2009-238518, filed on Oct. 15, 2009 including specification, claims, drawings and summary, on which the Convention priority of the present application is based, are incorporated herein by reference in its entirety.

What is claimed is:

1. A power semiconductor device comprising:
   a substrate;
   an element circuit pattern formed on said substrate and made of Cu covered with an electroless Ni—P plating layer; and
   a power semiconductor element bonded to said element circuit pattern by a solder;
   wherein said solder is an alloy of Sn, Sb, and Cu, and the weight percent of Cu is in the range of 0.5 to 1%, inclusive.

2. The power semiconductor device according to claim 1, wherein the weight percent of Sn in said alloy is in the range of 91 to 93%, inclusive, and the weight percent of Sb in said alloy is in the range of 6.5 to 8%, inclusive.

3. The power semiconductor device according to claim 2, further comprising:
   a terminal circuit pattern formed on said substrate; and
   a terminal bonded to said terminal circuit pattern by a terminal solder;
   wherein said terminal solder is an Sn—Ag-based or Sn—Ag—Cu-based unleaded solder having a liquidus temperature in the range of 215° to 220° C., inclusive; and
   wherein said solder has a solidus temperature in the range of 235° to 238° C., inclusive.

4. The power semiconductor device according to claim 1, wherein said Ni—P plating layer has a thickness in the range of 2 to 3 µm, inclusive.

5. A power semiconductor device comprising:
   a substrate;
   a circuit pattern which is an unplated Cu pattern formed on said substrate;
   a power semiconductor element bonded to said circuit pattern by a solder made of an alloy of Sn, Sb, and Cu;
   a terminal circuit pattern formed on said substrate;

a terminal bonded to said terminal circuit pattern by a terminal solder made of an Sn—Ag-based or Sn—Ag—Cu-based unleaded solder;

wherein the weight percent of Cu in said solder is in the range of 0.5 to 1%, inclusive, and said solder has a solidus temperature in the range of 235° to 238° C., inclusive; and wherein said terminal solder has a liquidus temperature in the range of 215° to 220° C., inclusive.

6. The power semiconductor device according to claim 5, further comprising:
 a bottom surface pattern formed on the surface of said substrate opposite that on which said circuit pattern is formed; and
 a heat sink bonded to said bottom surface pattern by a solder having the same composition as said solder;
wherein said heat sink is Cu and is not plated.

* * * * *